US007696443B2

(12) United States Patent
Lee et al.

(10) Patent No.: US 7,696,443 B2
(45) Date of Patent: Apr. 13, 2010

(54) ELECTRONIC DEVICE WITH A WARPED SPRING CONNECTOR

(75) Inventors: Yi-Chang Lee, Tainan (TW); An-Hong Liu, Tainan (TW); Yeong-Her Wang, Tainan (TW); Yeong-Ching Chao, Taichung (TW); Yao-Jung Lee, Rende Shiang (TW)

(73) Assignees: ChipMOS Technologies (Bermuda) Ltd., Hamilton (BM); ChipMOS Technologies Inc., Hsinchu (TW)

( * ) Notice: Subject to any disclaimer, the term of this patent is extended or adjusted under 35 U.S.C. 154(b) by 394 days.

(21) Appl. No.: 11/188,860

(22) Filed: Jul. 26, 2005

(65) Prior Publication Data

US 2006/0042834 A1    Mar. 2, 2006

(30) Foreign Application Priority Data

Aug. 24, 2004    (TW) .............................. 93125405 A

(51) Int. Cl.
*H01R 12/04*    (2006.01)
*H05K 1/11*    (2006.01)

(52) U.S. Cl. ...................... 174/267; 174/262; 257/735

(58) Field of Classification Search ......... 257/735–736; 29/842–845; 361/772–776, 789, 803; 174/267
See application file for complete search history.

(56) References Cited

U.S. PATENT DOCUMENTS 6,482,013 B2 *   11/2002   Eldridge et al. ............... 439/66
6,827,524 B2 *   12/2004   Starry et al. ................. 404/129

FOREIGN PATENT DOCUMENTS

TW             535226          6/2003

* cited by examiner

*Primary Examiner*—Jeremy C Norris
(74) *Attorney, Agent, or Firm*—WPAT, P.C.; Anthony King

(57) ABSTRACT

An electronic device comprises a substrate and at least a warped spring connector. The substrate has a signal bonding pad and a ground plane. The warped spring connector is disposed on the substrate and is connected to the bonding pad. The warped spring connector includes at least a ground lead electrically connected to the ground plane, a dielectric layer on the ground lead, and a transmitting lead on the dielectric layer. The transmitting lead is bonded to the bonding pad. The ground lead is isolated from and close to the transmitting lead to solve cross-talk and noise problem. Furthermore, the coefficient of thermal expansion of the transmitting lead is different from that of the dielectric layer or the ground lead such that the warped spring connector has a suspending end suspending away from the substrate.

17 Claims, 2 Drawing Sheets

226   225   224   223

ELECTRONIC DEVICE WITH A WARPED SPRING CONNECTOR

FIELD OF THE INVENTION

The present invention relates to an electronic device, and more particularly to an electronic device with a warped spring connector.

BACKGROUND OF THE INVENTION

There are various outer connections for electronic devices such as bumps, solder balls, bonding wires, probes, gold fingers, leads, etc. However, not all the outer connections are reliable after long hours of operation due to mismatch of the coefficients of thermal expansion (CTE) between the electronic devices and printed circuit boards connected by the outer connections. The capability of stress absorbing or buffering of the outer connections under larger temperature gradients becomes the key factor for ensuring good reliability. Any breakdown between outer connections and printed circuit boards will cause electrically open which leading to signal disconnections, i.e., system failure.

According to Taiwan Patent Publication Number 535,226 submitted by the applicants, entitled "an electronics device with needle electrodes and their fabrication", an electronic device with needle electrodes is proposed. Each needle electrode has a dielectric supporting layer to increase the stress absorption capability of the electrodes when under stresses and a metal layer on the dielectric supporting layer to conduct electrical signals to a printed circuit board. Please refer to FIG. 1, an electronic device comprises a substrate 110 and a plurality of needle electrodes 120, wherein the substrate 110 can be a chip, a wafer, a printed circuit board, or a ceramic substrate. A plurality of bonding pads 111 are disposed on the surface of the substrate 110. Each of the needle electrodes 120 includes a metal layer 121 and a PI supporting layer 122, where the metal layer 121 is electrically connected to the corresponding bonding pads 111 and is extended to the supporting layer 122 with a concave curvature. The supporting layer 122 is formed on the bottom of the corresponding metal layer 121 to support the metal layer 121. However, when higher density of electrical connections or smaller line widths and pitches are required, the cross talk and electrical-magnetic interferences between needle electrodes 120 will become severe. The needle electrodes cannot be implemented in high speed, high frequency applications.

SUMMARY OF THE INVENTION

A main purpose of the present invention is to provide an electronic device with at least a warped spring connector on a substrate. The warped spring connector includes a transmitting lead bonded to a signal bonding pad on the substrate and a dielectric layer under the transmitting lead. The warped spring connector further includes a ground lead disposed under the dielectric layer, wherein the ground lead is electrically connected to a ground plane in the substrate to avoid crosstalk and to eliminate noises. Therefore, the warped spring connector can extend a longer distance and be implemented in high speed, high frequency applications with higher density and smaller pitches.

A second purpose of the present invention is to provide an electronic device with at least a warped spring connector, which includes a ground lead, a dielectric layer, and a transmitting lead. Therein the dielectric layer is formed on the ground lead, and the transmitting lead is disposed on the dielectric layer. Moreover, the CTE of the transmitting lead is different from that of the dielectric layer or the ground lead such that the warped spring connector has a suspending end away from the substrate for outer signal interconnection.

According to the present invention, an electronic device comprises a substrate and at least a warped spring connector. The substrate has a signal bonding pad and a ground plane. The warped spring connector is disposed on the substrate and have a connection end and a suspending end. The connection end is connected to the substrate and the suspending end is away from the substrate. The warped spring connector includes a ground lead electrically connected to the ground plane, a dielectric layer formed on the ground lead, and a transmitting lead formed on the dielectric layer. The transmitting lead is bonded to the signal bonding pad of the substrate. In one embodiment, the coefficient of thermal expansion (CTE) of the transmitting lead is different from that of the dielectric layer or the ground lead to create an internal stress such that the suspending end can move further away from the substrate.

DETAIL DESCRIPTION OF THE INVENTION

Please refer to the attached drawings, the present invention will be described by means of an embodiment below.

Figure 1:
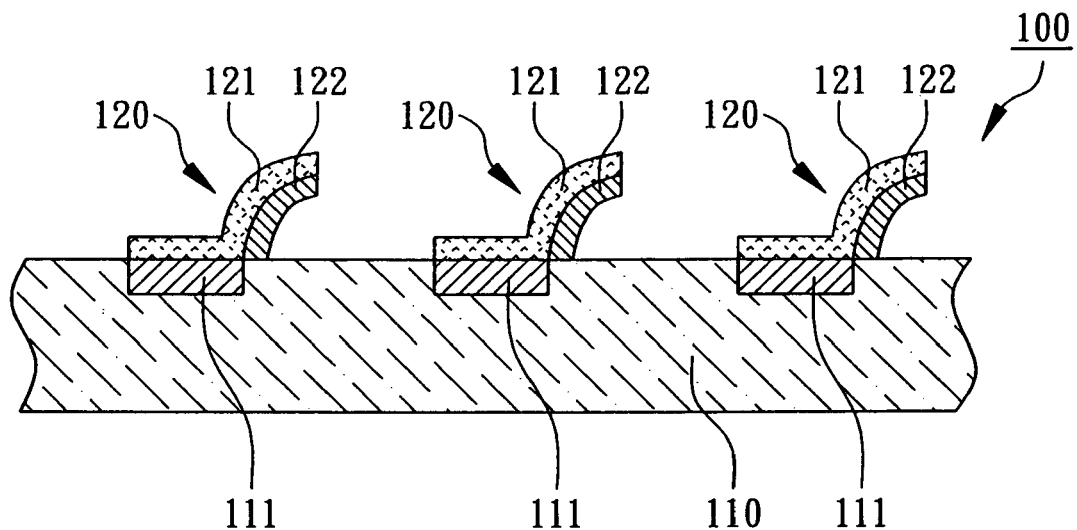
FIG. 1 is a cross-sectional view of an electronic device with needle electrodes.
Figure 2:
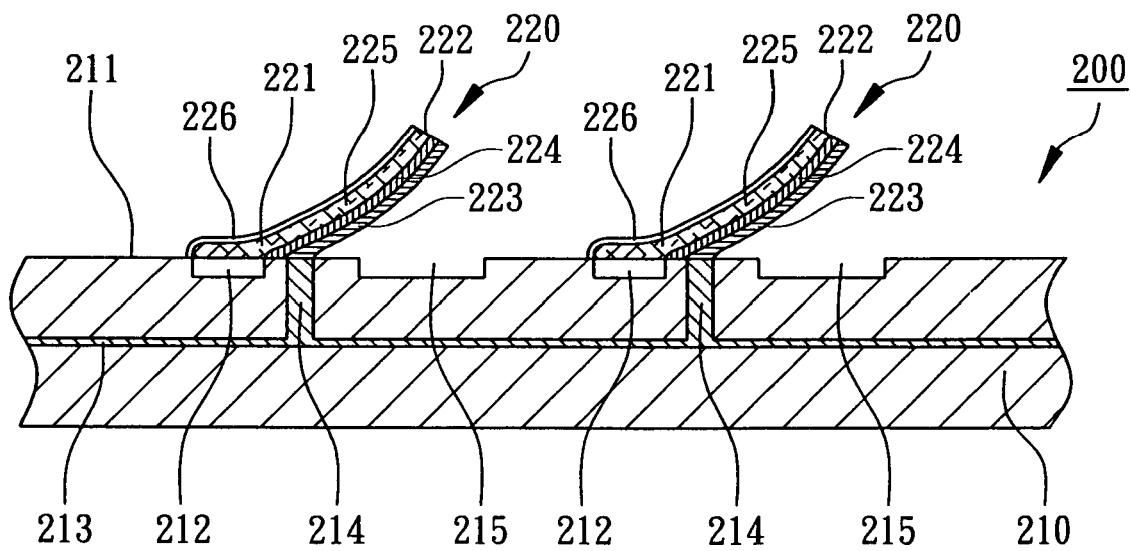
FIG. 2 is a horizontal cross-sectional view of an electronic device with warped spring connectors according to an embodiment of the present invention.

Referring to FIG. 2, an electronic device according to a preferred embodiment of the present invention is described. The electronic device 200 comprises a substrate 210 and a plurality of warped spring connectors 220. The substrate 210 has a plurality of signal bonding pads 212 on its surface 211, a ground plane 213 in the substrate 210, and a plurality of vias 214. The substrate 210 is chosen from the group consisting of wafer, chip, wafer-level chip scale package (WLCSP), silicon substrate, ceramic substrate, glass substrate, and printed circuit board. The surface 211 may be an active surface with integrated circuits (IC) or a probing surface of a probe head of a probe card so that the electronic device 200 can be implemented in IC packaging as well as in IC testing.

Figure 3:
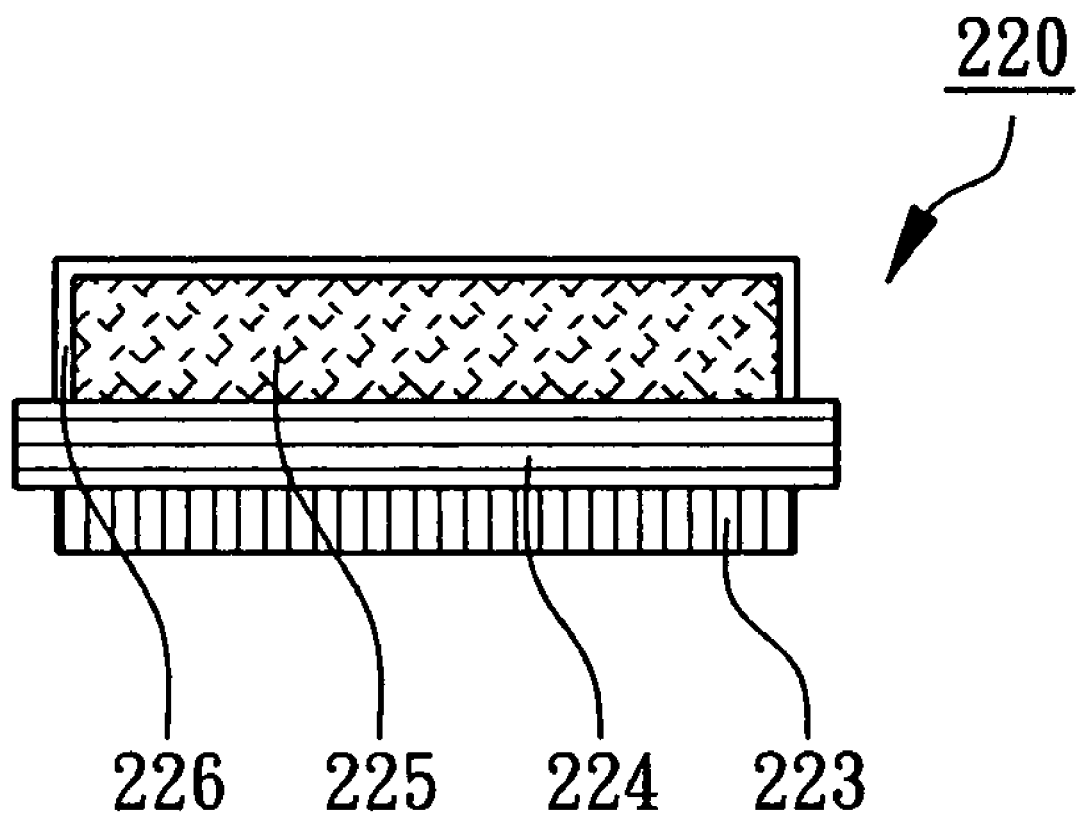
FIG. 3 is a vertical cross-sectional view of the warped spring connector according to the present invention.

Please refer to FIG. 2 and FIG. 3, the warped spring connectors 220 are disposed on the surface 211 of the substrate 210 and each has a connection end 221 and a suspending end 222. The connection ends 221 are connected to the substrate 210, and the suspending ends 222 are suspended away from the surface 211 of the substrate 210. Each warped spring connector 220 includes a ground lead 223, a dielectric layer 224, and a transmitting lead 225. The dielectric layers 224 are sandwiched between the ground leads 223 and the transmitting leads 225 for electrical isolation. The ground leads 223 can be made from nickel, gold, copper, tungsten, or palladium. The ground leads 223 at the connecting ends 221 are electrically connected to the ground plane 213 of the substrate 210 through the vias 214. The dielectric layers 224 are formed on the corresponding ground leads 223. Preferably, the dielectric layers 224 at the connection ends 221 are connected with the dielectric film over the substrate 210, wherein the dielectric film may be a passivation layer of a wafer, a solder mask or a cover layer of a printed circuit board. Moreover, the dielectric layers 224 are made by PI, BCB, or other flexible dielectric materials. Please refer to FIG. 3. the width of the dielectric layers 224 is larger than the width of the transmitting leads 225 to electrically isolate the transmitting leads 225 and the ground leads 223. The transmitting leads 225 are formed on the dielectric layers 224 and are bonded to the signal bonding pads 212 of the substrate 210. The transmitting leads 225 can contain a metal chosen from the group consisting of nickel, gold, copper, tungsten, or palladium. The thickness of the transmitting leads 225 is larger than the thickness of the ground leads 223, and the CTE of the transmitting leads 225 is smaller than the CTE of the dielectric layer 224 or/and the CTE of the ground leads 223. For example, the transmitting leads 225 are made of Invar, Kovar with a very low CTE. Therefore, an internal thermal stress inside the warped spring connectors 220 is created such that the suspending ends 222 move further away from the substrate 210 as operation temperature increases. It is to provide more flexibility for stress absorption or buffering, i.e., the reliability of the electronic device 200 is enhanced. Preferably, each warped spring connector 220 further includes an anti-wetting metal layer 226, such as palladium (Pd), which covers each transmitting lead 225 to prevent metal oxidation and metal contamination from the bonding pads. The thickness of the anti-wetting metal layers 226 in the range of several hundred Å to several micrometers (μm) is much smaller than the thickness of the transmitting leads 225 in the range of 10 to 100 μm.

The ground leads 223 act as ground shielding for the corresponding transmitting leads 225. Therefore, the signal transmission between the transmitting leads 225 will not be interfered by other transmitting leads 225 nor the circuits inside the substrate 210 nor the EMI from a printed circuit board. The crosstalk and noise can be well isolated or eliminated by means of the warped spring connectors 220. The structure of the warped spring connectors 220 is most suitable for longer and thinner electrical connections with better stress absorption capability for smaller pitches and higher density high speed, high frequency applications.

As shown in FIG. 2, the warped spring connectors 220 are fabricated by electroplating, sputtering, or deposition in the sequence of the ground leads 223, the dielectric layers 224, and the transmitting leads 225. During the fabrication processes, a sacrificial layer (not shown in the figure), such as photoresist or etchable metal, is formed between the ground leads 223 and the substrate 210 except the connecting ends 221, and then the ground leads 223 are formed on the sacrificial layer on the surface 211 of the substrate 220. Accordingly, the ground leads 223 can be easily released and separated from the surface 211 of the substrate 210 after finishing the dielectric layers 224 and the transmitting leads 225. Then due to the CTE mismatch between the transmitting leads 225 and the dielectric layers 224 or between the transmitting leads 225 and the ground leads 223, the suspending ends 222 of the warped spring connectors 220 can be released in the air and suspended away from the surface 211 of the substrate 210. Preferably, a recess 215 is formed in the surface 211 of the substrate 220 for formation of the sacrificial layer to easily separate the ground leads 223 from the substrate 210.

The above description of embodiments of this invention is intended to be illustrative and not limiting. Other embodiments of this invention will be obvious to those skilled in the art in view of the above disclosure.

What is claimed is:

1. An electronic device comprising:
   a substrate having at least signal bonding pad and a ground plane; and
   at least a warped spring connector disposing on the substrate and having a suspending end away from the substrate, the warped spring connector including:
      a ground lead electrically connected to the ground plane;
      a dielectric layer on the ground lead; and a transmitting lead formed on the dielectric layer and bonded to the signal bonding pad,
   wherein the ground lead is formed on a surface of the substrate, and a recess is formed in the surface for separating the ground lead from the substrate.

2. The electronic device of claim 1, wherein the coefficient of thermal expansion of the transmitting lead is smaller than that of the dielectric layer.

3. The electronic device of claim 2, wherein the thickness of the transmitting lead is larger than the thickness of the ground lead.

4. The electronic device of claim 1, wherein the coefficient of thermal expansion of the transmitting lead is smaller than that of the ground lead.

5. The electronic device of claim 1, wherein the warped spring connector further includes an anti-wetting metal layer formed on the transmitting lead.

6. The electronic device of claim 1, wherein the dielectric layer is wider than the transmitting lead.

7. The electronic device of claim 1, wherein the substrate is chosen from a group consisting of wafer, chip, wafer-level chip scale package, silicon substrate, ceramic substrate, glass substrate, or printed circuit board.

8. The electronic device of claim 1, wherein the substrate is the probe head of a probe card.

9. An electronic device comprising:
   a substrate having at least a signal bonding pad and a ground plane; and
   at least a warped spring connector disposing on the substrate, the warped spring connector including:
      a ground lead electrically connected to the ground plane;
      a dielectric layer on the ground lead; and
      a transmitting lead formed on the dielectric layer and bonded to the signal bonding pad;
   wherein the coefficient of thermal expansion of the transmitting lead is different from that of the dielectric layer or the ground lead to create an internal stress such that the warped spring connector has a suspending end suspending away from the substrate,
   wherein the ground lead is formed on a surface of the substrate, and a recess is formed in the surface for separating the ground lead from the substrate.

10. The electronic device of claim 9, wherein the warped spring connector further includes an anti-wetting metal layer formed on the transmitting lead.

11. An electronic device comprising:
   a substrate having at least signal bonding pad and a ground plane, the ground plane being formed inside the substrate in a position underlying the signal bonding pad;
   at least a warped spring connector disposing on the substrate and having a suspending end away from the substrate, the warped spring connector including:
      a ground lead electrically connected to the ground plane;
      a dielectric layer, the ground lead is formed directly on a lower surface of the dielectric layer; and
      a transmitting lead formed directly on an upper surface of the dielectric layer and bonded to the signal bonding pad, a coefficient of thermal expansion of the transmitting lead is smaller than a coefficient of thermal expansion of the ground; and a via adjacent to the signal bonding pad. the via connecting only the ground plane to the ground lead, the lower surface of the dielectric layer facing the via.

12. The electronic device of claim 11, wherein the coefficient of thermal expansion of the transmitting lead is smaller than that of the dielectric layer.

13. The electronic device of claim 12, wherein the thickness of the transmitting lead is larger than the thickness of the ground lead.

14. The electronic device of claim 11, wherein the warped spring connector further includes an anti-wetting metal layer formed on the transmitting lead.

15. The electronic device of claim 11, wherein the dielectric layer is wider than the transmitting lead.

16. The electronic device of claim 11, wherein the substrate is chosen from a group consisting of wafer, chip, wafer-level chip scale package, silicon substrate, ceramic substrate, glass substrate, or printed circuit board.

17. The electronic device of claim 11, wherein the substrate is the probe head of a probe card.

* * * * *